(12) United States Patent
Wald et al.

(10) Patent No.: US 9,081,055 B2
(45) Date of Patent: Jul. 14, 2015

(54) METHOD FOR REDUCING LOCAL SPECIFIC ABSORPTION RATE IN MAGNETIC RESONANCE IMAGING USING RADIO FREQUENCY COIL ARRAY DARK MODES

(75) Inventors: Lawrence L Wald, Cambridge, MA (US); Kawin Setsompop, Charlestown, MA (US)

(73) Assignee: THE GENERAL HOSPITAL CORPORATION, Boston, MA (US)

(*) Notice: Subject to any disclaimer, the term of this patent is extended or adjusted under 35 U.S.C. 154(b) by 499 days.

(21) Appl. No.: 13/453,208

(22) Filed: Apr. 23, 2012

(65) Prior Publication Data

US 2013/0002249 A1 Jan. 3, 2013

Related U.S. Application Data

(60) Provisional application No. 61/478,110, filed on Apr. 22, 2011.

(51) Int. Cl.
*G01R 33/28* (2006.01)
*G01R 33/483* (2006.01)

(52) U.S. Cl.
CPC .......... *G01R 33/288* (2013.01); *G01R 33/4833* (2013.01)

(58) Field of Classification Search
CPC .......................... G01R 33/288; G01R 33/4833
See application file for complete search history.

(56) References Cited

U.S. PATENT DOCUMENTS

| 7,078,900 B2* | 7/2006 | Vu ............................... 324/314 |
| 7,403,004 B2* | 7/2008 | Morich et al. ................ 324/309 |
| 7,511,492 B2* | 3/2009 | Sodickson et al. ............ 324/309 |
| 7,795,870 B2* | 9/2010 | Sodickson et al. ............ 324/309 |
| 8,085,046 B2 | 12/2011 | Zelinski et al. |

OTHER PUBLICATIONS

Alagappan, et al., Degenerate Mode Band-Pass Birdcage Coil for Accelerated Parallel Excitation, Magnetic Resonance in Medicine, 2007, 57:1148-1158.
Alagappan, et al., A Simplified 16-Channel Butler Matrix for Parallel Excitation with the Birdcage Modes at 7T, Proc. Intl. Soc. Mag. Reson. Med., 2008, 16:144.
Alagappan, et al., Mode Compression of Transmit and Receive Arrays for Parallel Imaging at 7T, Proc. Intl. Soc. Mag. Reson. Med., 2008, 16:619.

(Continued)

*Primary Examiner* — Dixomara Vargas
(74) *Attorney, Agent, or Firm* — Quarles & Brady, LLP

(57) ABSTRACT

A method for reducing local specific absorption rate ("SAR") during imaging of a subject with a magnetic resonance imaging ("MRI") system is provided. A radio frequency ("RF") excitation pattern is selected for an RF coil array to be used during the imaging. In this RF excitation pattern, locations in which local SAR exceeds a preselected threshold value are identified. Examples of threshold values include regulatory limits on local SAR. Using the identified local SAR hotspot locations, a cancellation electric field pattern that is defined by so-called "dark modes" of the coil array is determined. Imaging of the subject commences using the RF coil array and the MRI system, in which the RF coil array is used to simultaneously produce an RF excitation field and a cancellation electric field using the respective field patterns. This simultaneous production of the RF excitation and cancellation electric fields reduces local SAR at the hotspot locations.

13 Claims, 3 Drawing Sheets

(56) References Cited

OTHER PUBLICATIONS

Brunner, et al., Optimal Design of Multiple-Channel RF Pulses Under Strict Power and SAR Constraints, Magnetic Resonance in Medicine, 2010, 63(5):1280-1291.

Gebhardt, et al., Evaluation of Maximum Local SAR for Parallel Transmission (pTx) Pulses Based on Pre-Calculated Field Data Using a Selected Subset of "Virtual Observation Points", Proc. Intl. Soc. Mag. Reson. Med., 2010, 18:1441.

Graesslin, et al., SAR Hotspot Reduction by Temporal Averaging in Parallel Transmission, Proc. Intl. Soc. Mag. Reson. Med., 2009, 17:176.

Graesslin, et al., Local SAR Constrained Hotspot Reduction by Temporal Averaging, Proc. Intl. Soc. Mag. Reson. Med., 2010, 18:4932.

Katscher, et al., Transmit SENSE, Magnetic Resonance in Medicine, 2003, 49:144-150.

Katscher, Theoretical and Numerical Aspects of Transmit SENSE, IEEE Transactions on Medical Imaging, 2004, 23(4):520-525.

Katscher, et al., Parallel RF Transmission in MRI, NMR in Biomedicine, 2006, 19:393-400.

Lattanzi, et al., Electrodynamic Constraints on Homogeneity and RF Power Deposition in Multiple Coil Excitations, Magn. Reson. Med., 2009, 61(2):315-334.

Lee, et al., Parallel Transmit RF Design with Local SAR Constraints, Proc. Intl. Soc., Mag. Reson. Med., 2010, 18:105.

Zelinski, Improvements in Magnetic Resonance Imaging Excitation Pulse Design, Thesis Paper Submitted to the Department of Electrical Engineering and Computer Science, Massachusetts Institute of Technology, Sep. 2008.

Zelinski, et al., Specific Absorption Rate Studies of the Parallel Transmission of Inner-Volume Excitations at 7 Tesla, J. Magn. Reson. Imaging, 2008, 28(4):1005-1018.

Zhu, Parallel Excitation With an Array of Transmit Coils, Magnetic Resonance in Medicine, 2004, 51:775-784.

\* cited by examiner

US 9,081,055 B2

METHOD FOR REDUCING LOCAL SPECIFIC ABSORPTION RATE IN MAGNETIC RESONANCE IMAGING USING RADIO FREQUENCY COIL ARRAY DARK MODES

CROSS-REFERENCE TO RELATED APPLICATIONS

This application claims the benefit of U.S. Provisional Patent Application Ser. No. 61/478,110, filed on Apr. 22, 2011, and entitled "METHOD FOR REDUCING LOCAL SPECIFIC ABSORPTION RATE IN MAGNETIC RESONANCE IMAGING USING RADIO FREQUENCY COIL ARRAY DARK MODES."

BACKGROUND OF THE INVENTION

The field of the invention is systems and methods for magnetic resonance imaging ("MRI"). More particularly, the invention relates to systems and methods for reducing local specific absorption rate ("SAR") in a subject imaged with MRI.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a radio frequency ("RF") excitation field, $B_1$, that is in the x-y plane and that includes a frequency component near the Larmor frequency, the net aligned moment, $M_z$, of the nuclei may be rotated, or "tipped," into the x-y plane to produce a net transverse magnetic moment, $M_{xy}$. An "MR" signal is emitted by the excited nuclei or "spins," after the RF excitation field, $B_1$, is terminated, and this signal may be received and processed to form an image.

In producing an image from the emitted MR signals, the MR signals are spatially encoded using magnetic field gradients ($G_x$, $G_y$, and $G_z$) so that the detected MR signals can be attributed to the appropriate locations in an image. Typically, the region to be imaged is scanned by a sequence of measurement cycles in which these gradients vary according to the particular localization method being used. The resulting set of received MR signals are digitized and processed to reconstruct an image using one of many well known reconstruction techniques.

The success of parallel reconstruction methods and their impact on image encoding has sparked a great deal of interest in using the spatial distribution of RF transmit coils in an analogous fashion commonly referred to as "parallel transmit," "parallel transmission," or simply "pTx." For example, by breaking down the RF transmit field into multiple regions that are each controlled by a separate transmit channel, spatial degrees of freedom are created that allow the spatial information in the array to be exploited in the excitation process. Anatomy-specific excitations could potentially reduce image encoding needs, such as for cardiac or shoulder imaging, by reducing the required field-of-view; allow selective spin-tagging excitations, thereby potentially allowing vessel territory perfusion imaging; or simply provide clinically useful, but nontraditional, excitations, such as curved saturation bands for the spine or brain.

While the development of these novel RF pulse designs and applications continue to be an area of intense development, the clinical utility of a given RF excitation pulse is characterized by more than just its spatial fidelity. Particularly, the specific absorption rate ("SAR") of an RF excitation pulse is often the critical limiting factor when applied to a clinical imaging sequence because SAR. For a discussion of the regulatory concerns on SAR in the United States, see, for example, Center for Devices and Radiologic Health "Guidance for the Submission of Premarket Notifications for Magnetic Resonance Diagnostic Devices," Rockville, Md.: Food and Drug Administration, 1998; and in Europe, see, for example, International Electrotechnical Commission, "International Standard, Medical Equipment-Part 2: Particular Requirements for the Safety of Magnetic Resonance Equipment for Medical Diagnosis, 2nd Revision," Geneva: International Electrotechnical Commission, 2002.

The need to stay below safe SAR limits often requires unfavorable tradeoffs in acquisition parameters such as increased repetition time ("TR") or reduced flip angle. SAR becomes especially problematic at field strengths of 3 Tesla, where the power needed for a given flip angle increases as much as four-fold as compared to 1.5 Tesla applications. Regulatory limits on SAR rely on two different parameters: the global average power deposited in a given body part, and the local SAR deposited in any ten grams of tissue. Often, global power must be reduced to insure that an imaging session remains within the local SAR limits. Therefore, it would be beneficial to provide a method for reducing local SAR without undue tradeoffs to other imaging parameters.

One existing solution to the local SAR problem in parallel transmit penalizes local SAR during the design of RF excitation pulses. Such an approach has proved to be computationally difficult because the location of the local SAR hotspot can be anywhere in the body. Attempts to make local SAR penalization methods more computationally feasible have included incorporating image compression methods into the RF excitation pulse design, while other methods have attempted to make the local SAR hotspots change position with time by using different excitations for different k-space lines.

Another proposed solution to the local SAR problem is to employ slightly different gradient trajectories for each pulse in order to force different local SAR patterns. For example, a slice-selective spoke-trajectory excitation could be generated from any one of hundreds of k-space spoke trajectories. Combing through these solutions produces dozens of candidates within a given spatial fidelity and with different local SAR patterns. An even more sophisticated formalism computes the average SAR pattern from the collection of pulses and optimizes the individual pulses based on this time-averaged pattern.

In light of the foregoing, it would be desirable to provide a method for reducing local SAR in parallel transmit MRI that is less computationally intensive than currently existing methods. It would also be desirable to provide a method for reducing local SAR that includes reducing the influence of local SAR hotspots.

SUMMARY OF THE INVENTION

The present invention overcomes the aforementioned drawbacks by providing a method for reducing local specific absorption rate ("SAR") during imaging of a subject with a magnetic resonance imaging ("MRI") system by using so-called "dark modes" that do not produce significant excitation of a spin system to cancel the local electric radio frequency ("RF") field responsible for local SAR hotspots. An example of such a "dark mode" is an RF coil array mode that produces circularly polarized excitation fields with a handedness that does not generate transverse spin magnetization, or one that produces magnetic fields parallel to the main magnetic field, $B_0$, of the MRI system, which also does not generate transverse spin magnetization. A magnetization pattern is selected for an RF coil array to be used during the imaging. In achieving this pattern and RF excitation is sent to each transmit coil, which creates a spatial pattern of RF magnetic and electric fields, locations in which the electric field produces local SAR that exceeds a preselected threshold value are identified. Examples of threshold values include regulatory limits on local SAR. Noting the local electric fields at the identified local SAR hotspot locations, a cancellation electric field pattern that can be created by so-called "dark modes" of the coil array is determined. Imaging of the subject commences using the RF coil array and the MRI system, in which the RF coil array is used to simultaneously produce the magnetization excitation pattern and the cancellation electric field using the respective "dark modes" field patterns. This simultaneous production of the RF excitation and cancellation electric fields reduces local SAR at the hotspot locations.

It is an aspect of the invention to assess the use of the spatial degrees of freedom provided by multiple transmit coil arrays for reducing local SAR in both specialized excitations and conventional slice selective excitations. Success in eliminating hotspots allows shorter excitations with greater spatial fidelity, thereby significantly benefiting clinical imaging.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
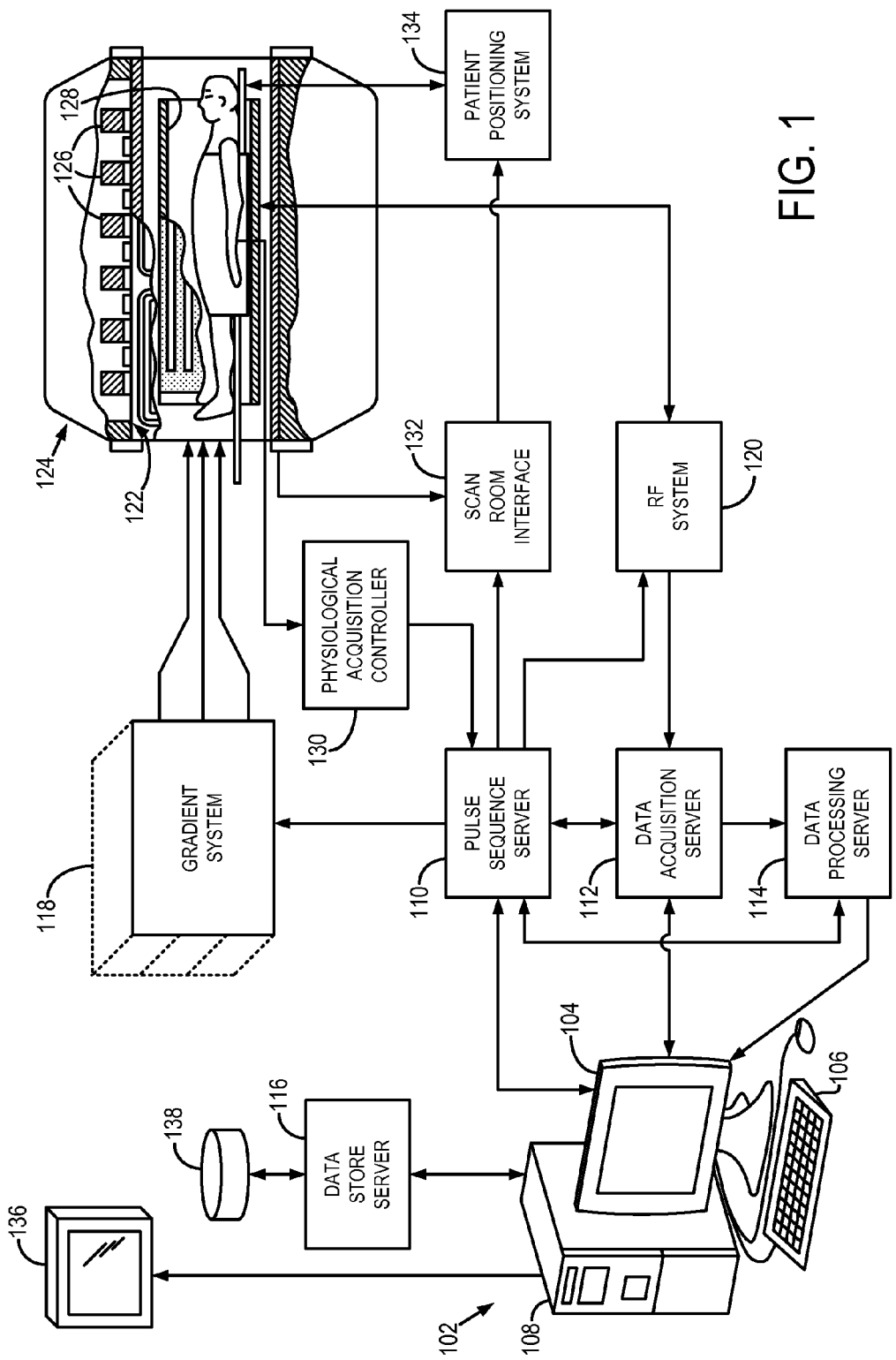
FIG. 1 is a block diagram of an example of a magnetic resonance imaging ("MRI") system.

A method for cancelling local electric fields at one or multiple locations in the body during the excitation phase of a magnetic resonance imaging ("MRI") procedure in order to reduce local specific absorption rate ("SAR") is provided. These local electric fields cause radio frequency ("RF") currents in the body, which deposit energy in the body, thereby causing local increases in SAR. As discussed above, local SAR is limited by regulatory authorities, and keeping local SAR below these limits often requires compromises in image acquisition timing or excitation pulse profile.

The provided method takes advantage of the degrees of freedom of RF excitation afforded by an array of RF transmit coils. Particularly, the provided method takes advantage of a coil array's ability to generate different modes of RF excitation fields. Generally, each mode of a coil array is a linear combination of the inputs to the coil array. When the number of transmit channels available for a coil array is low, it is beneficial to form modes of the array that concentrate most of the transmit power into a few transmit channels. These efficient channels may then be selected for connection to the transmit hardware channels. Such an approach is referred to as a coil array mode compression technique, which is described, for example, in U.S. patent application Ser. No. 12/550,074, entitled "Coil Array Mode Compression for Parallel Transmission Magnetic Resonance Imaging," which is herein incorporated by reference in its entirety.

In general, a coil array has the ability to generate modes that are circularly polarized in both the conventional handedness that is needed for excitation of the spins, the so-called circularly polarized ("CP") mode, $B_1^+$, and the opposite handedness, the so-called anti-circularly polarized ("ACP") mode, $B_1^-$. Typically, the ACP modes are not used for producing an RF excitation field because they do not produce excitation of the spin system. For this reason, these ACP modes and other modes that do not produce significant excitation of a spin system are referred to herein as "dark modes." Other modes that do not produce significant excitation of the spins, but produce electric fields, include those generated by coils with primary excitation fields, $B_1$, that are parallel to the main magnetic field, $B_0$, or that are positioned above or below the slice location being excited. In this latter situation, the electromagnetic fields produced by the coils do not contribute to resonant excitation at the slice location, but do produce electromagnetic fields in tissue overlapping with the coil array elements that are used to excite the slice. In the provided method, these dark modes are used to cancel local electric fields that produce local SAR hotspots.

In the provided method, a mode compression technique is utilized to determine dark modes that produce electric fields, but do not produce significant excitation of a spin system. In this scheme, a mode, refers to a commonly excited linear combination of the individual coil elements that constitute the coil array, driven in a particular linear combination. Typically, these coil elements are excited in parallel, each with a different phase and amplitude. For example, an array of strip-line or loop coil elements arranged around a cylinder can be driven with equal amplitude but progressively increasing phase increments using a Butler matrix to produce the circularly polarized birdcage modes, as described, for example, by V. Alagappan, et al., in "Degenerate Mode Band-Pass Birdcage Coil for Accelerated Parallel Excitation," *Magnetic Resonance in Medicine*, 2007; 57(6):1148-1158. In the provided method, the modes with circular polarization that is incorrect to excite a spin system form the subset of dark modes. The dark mode subset can be identified by using the subset to produce an RF excitation field and noting the relatively low level of excitation for a given applied power. The dark modes can also be optimized by optimizing the coefficients used to form the modes in order to maximize the excitation difference between the so-called "bright modes" that produce excitation of the spin system, and the dark modes.

Because the dark modes produce electric fields, but not useful excitation of the spin system, these dark modes can be energized to cancel local SAR hotspots. While it might seem counterintuitive to add energy that does not aid in the excitation of the spin system in order to reduce the energy deposited to a subject under examination, it is important to keep in mind that the goal is not to reduce global SAR, but local SAR, which is often a critical limiting factor for imaging. Thus, by adding a cancelling electric field at the locations of local SAR hotspots, these local SAR hotspots can be reduced or eliminated, even though SAR may be increased elsewhere. Thus, in cases where local SAR regulatory limits severely limit imaging capabilities, the provided method can be used to reduce these local SAR hotspots while accepting small increases in global SAR.

By way of example, the birdcage modes of a cylindrical coil array formed by a Butler matrix for excitation k-space spoke trajectories and RF shimming may be used. These modes are spatially orthogonal, which begs the questions of how to cancel a given electric field vector by applying an orthogonal field. The solution to this is that the spatial orthogonality of the electric fields of different modes is a global property. Therefore, the integral over space of the product of the two dissimilar modes vanishes. Also, the local electromagnetic field is shaped by the conductive and dielectric properties of the subject, which are not symmetric. Locally, there is no guarantee of orthogonality among modes. Thus, the electric field at a specific location can still be canceled, even if the electric field cannot be canceled everywhere. As noted above, this results in the difficulty of reducing global SAR with the provided method. However, as also noted above, because the limiting factor is local SAR, which can be reduced, the difficulties with reducing global SAR are of a lesser concern. For example, if local SAR limits strongly dominate a particular imaging application, the provided method can significantly reduce these local SAR hotspots while raising global SAR only modestly.

It is noted that coil geometries where the $B_1$ field is directed along the same direction as the main magnetic field, $B_0$, constitute a second coil type that has potential for generating dark modes. It is also worth noting that ACP mode channels are an extreme case of dark modes where it is easy to visualize how electric fields might be added without impacting excitation; thus, it is important to note that all coil array excitation patterns with spatial patterns that differ from the desired excitation may offer a potential for reducing local SAR hotspots to some degree.

Figure 3:
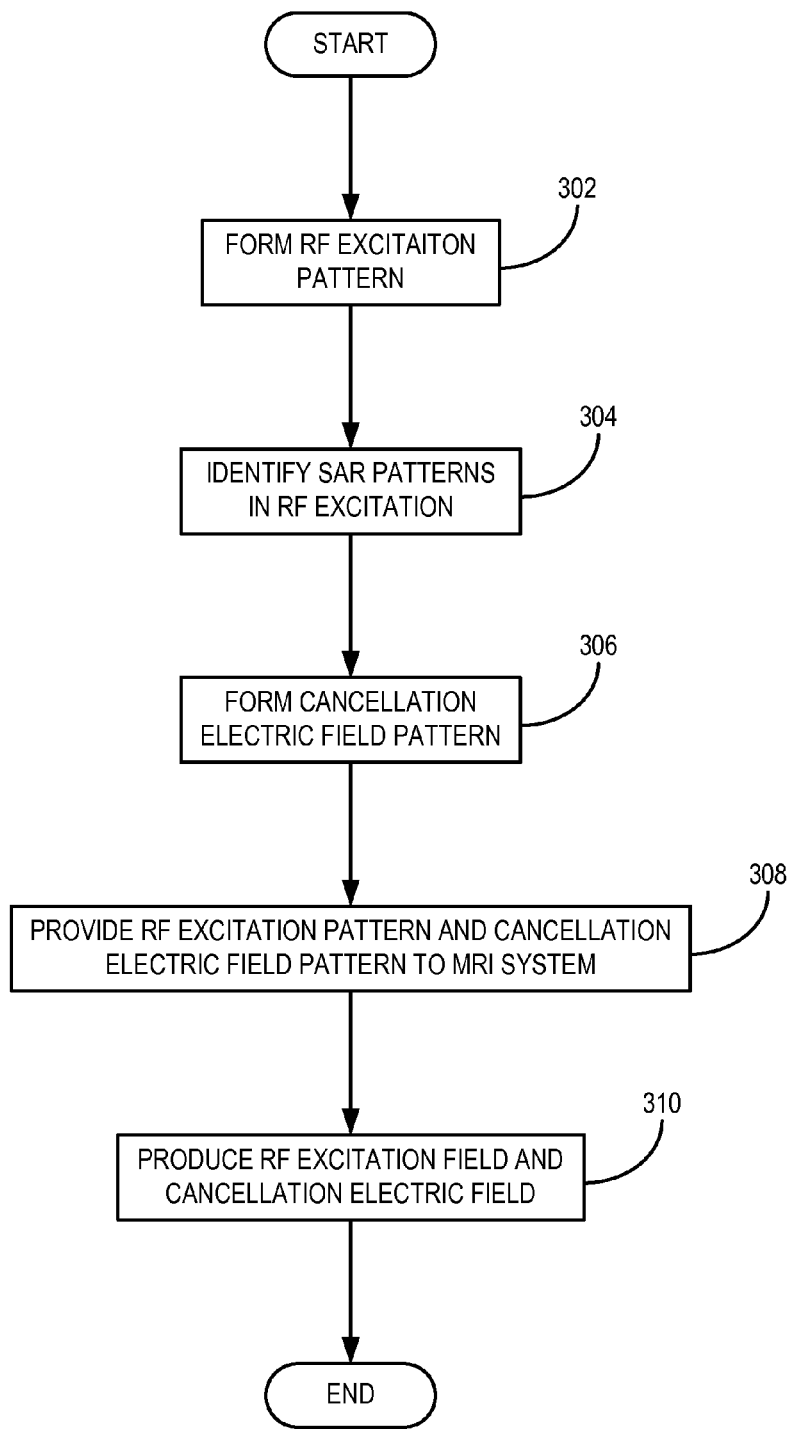
FIG. 3 is a flowchart setting forth the steps of an example of a method for reducing local specific absorption rate ("SAR") using dark modes of an RF coil or coil array.

Referring to FIG. 3, a flowchart setting forth the steps of an example of a method for determining an RF excitation pattern that reduces local SAR is illustrated. The method begins by forming a desired RF excitation pattern using the CP modes ("bright modes") of the coil array that will be used for imaging, as indicated at step 302. This RF excitation pattern is then analyzed to identify SAR patterns therein, as indicated at step 304. Particularly, local hotspots or maximums in the SAR patterns are identified. The identified SAR patterns are used to form a cancellation electric field pattern using the dark modes of the coil array, as indicated at step 306. For example, the cancellation electric field pattern is formed such that the produced cancellation electric field significantly reduces the local SAR hotspots maximum identified in the SAR patterns of the RF excitation field. By way of example, the desired dark modes can be calculated using a modified mode compression technique, in which the following minimization is performed:

$$\min\{\|E_B - E_D \cdot v_D\|^2 + \lambda \|v_D\|^2\} \quad (1);$$

where $E_B$ is the electric field at the hotspots that results from the bright modes; $E_D$ is the electric field at the hotspots that results from the dark modes; $v_D$ is a vector containing the voltage drives for the dark modes that will be used to produce the cancellation electric field; and $\lambda$ is a regularization parameter. Using the approach in Eqn. (1), the dark modes that cancel out the electric fields at the local SAR hotspot locations are produced; however, this approach does not take into account the minimal effect that the dark modes may have on excitation of the spin system. Thus, to determine dark modes that both reduce the local SAR hotspots and contribute to the excitation of the spin system, the following minimization may be performed:

$$\min\{\|E_B - E_D \cdot v_D\|^2 + \lambda_1 \|v_D\|^2 + \lambda_2 \|(m_D - m_B) - A_D \cdot v_D\|^2\} \quad (2);$$

where $m_D$ is the desired excitation; $m_B$ is the excitation produced by the bright modes; $(m_D - m_B)$ represents the excitation error after bright mode excitation; $\lambda_1$ and $\lambda_2$ are regularization parameters; and $A_D \cdot v_D$ represents the excitation produced by the dark modes driven with the voltages, $v_D$. Thus, using this approach, the overall excitation performance can be improved because the dark modes are further tailored to reduce excitation error from the bright modes.

The RF excitation pattern and the cancellation electric field pattern are then provided to an MRI system, as indicated at step 308, where they will be used to simultaneously produce an RF excitation field and a cancellation electric field, as indicated at step 310. This simultaneous production of the RF excitation and cancellation electric fields acts to cancel portions of the local electric fields of the primary excitation and, thus, reduce local SAR maximums. Because the dark modes used to produce the RF cancellation field do not produce excitation of the spin system, the fidelity of the RF excitation is unaltered by the SAR cancelling, dark-mode RF cancellation field.

Referring particularly now to FIG. 1, an example of a magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad (3);$$

and the phase of the received MR signal may also be determined:

$$\phi = \tan^{-1}\left(\frac{Q}{I}\right). \quad (4)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
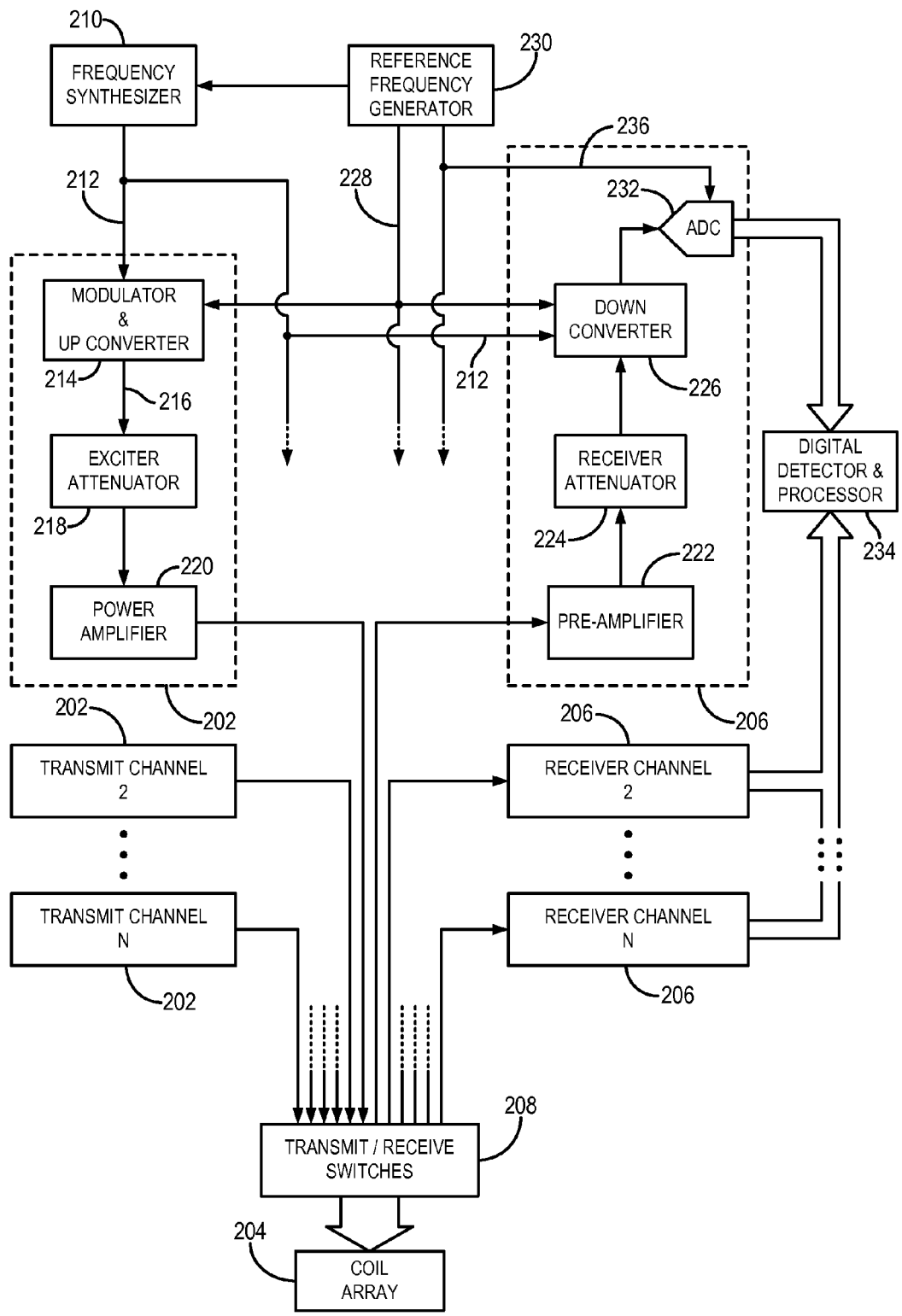
FIG. 2 is a block diagram of an example of a radio frequency ("RF") system that forms part of the MRI system of FIG. 1.

As shown in FIG. 1, the radiofrequency ("RF") system 120 may be connected to the whole body RF coil 128, or, as shown in FIG. 2, a transmission section of the RF system 120 may connect to one or more transmit channels 202 of an RF coil array 204 and a receiver section of the RF system 120 may connect to one or more receiver channels 206 of the RF coil array 204. The transmit channels 202 and the receiver channels 206 are connected to the RF coil array 204 by way of one or more transmit/receive ("T/R") switches 208.

Referring particularly to FIG. 2, the RF system 120 includes one or more transmit channels 202 that produce a prescribed RF excitation field. The base, or carrier, frequency of this RF excitation field is produced under control of a frequency synthesizer 210 that receives a set of digital signals from the pulse sequence server 110. These digital signals indicate the frequency and phase of the RF carrier signal produced at an output 212. The RF carrier is applied to a modulator and up converter 214 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 216 is attenuated by an exciter attenuator circuit 218 that receives a digital command from the pulse sequence server 110. The attenuated RF excitation pulses are then applied to a power amplifier 220 that drives the RF coil array 204.

The MR signal produced by the subject is picked up by the RF coil array 202 and applied to the inputs of the set of receiver channels 206. A preamplifier 222 in each receiver channel 206 amplifies the signal, which is then attenuated by a receiver attenuator 224 by an amount determined by a digital attenuation signal received from the pulse sequence server 110. The received signal is at or around the Larmor frequency, and this high frequency signal is down converted in a two step process by a down converter 226. The down converter 226 first mixes the MR signal with the carrier signal on line 212 and then mixes the resulting difference signal with a reference signal on line 228 that is produced by a reference frequency generator 230. The down converted MR signal is applied to the input of an analog-to-digital ("A/D") converter 232 that samples and digitizes the analog signal. The sampled and digitized signal is then applied to a digital detector and signal processor 234 that produces 16-bit in-phase (I) values and 16-bit quadrature (Q) values corresponding to the received signal. The resulting stream of digitized I and Q values of the received signal are output to the data acquisition server 112. In addition to generating the reference signal on line 228, the reference frequency generator 230 also generates a sampling signal on line 236 that is applied to the A/D converter 232.

The present invention has been described in terms of one or more preferred embodiments, and it should be appreciated that many equivalents, alternatives, variations, and modifications, aside from those expressly stated, are possible and within the scope of the invention.

The invention claimed is:

1. A computer-implemented method for controlling a magnetic resonance imaging (MRI) system to reduce local specific absorption rate (SAR) when imaging a subject with the MRI system, the steps of the method comprising:
 a) selecting, with a computer system, a magnetization excitation pattern for a radio frequency (RF) coil array;
 b) identifying, with a computer system, locations in the selected magnetization excitation pattern that are associated with local SAR values that exceed a preselected threshold value;

c) determining, with a computer system, a cancellation electromagnetic field pattern that is defined by dark modes of the RF coil array using the locations identified in step b);

d) controlling the MRI system, with a computer system, to direct the RF coil array to simultaneously produce an RF excitation field and a cancellation electromagnetic field using the magnetization excitation pattern selected in step a) and the cancellation electromagnetic field pattern determined in step c), respectively;

e) acquiring image data with the MRI system, the image data being acquired from the subject in response to the RF excitation field and cancellation electromagnetic field produced in step d); and wherein the simultaneous production of the RF excitation field and the cancellation electromagnetic field in step d) reduces local SAR at the locations identified in step b).

2. The method as recited in claim 1 in which the preselected threshold value in step b) is selected based on regulatory limits for local SAR.

3. The method as recited in claim 1 in which step c) includes minimizing an objective function that relates electromagnetic field values at the locations identified in step b) to both cancellation electromagnetic field values at the locations identified in step b) and to the dark modes of the coil array.

4. The method as recited in claim 3 in which the objective function minimized in step c) accounts for excitation produced by a cancellation electromagnetic field associated with the cancellation electromagnetic field pattern.

5. The method as recited in claim 4 in which the objective function minimized in step c) accounts for errors in the magnetization excitation pattern selected in step a).

6. A computer-implemented method for controlling a radio frequency (RF) coil array to produce an electromagnetic field in which local specific absorption rate (SAR) is significantly reduced, the steps of the method comprising:

a) selecting, with a computer system, an RF electromagnetic field pattern for the RF coil array;

b) identifying, with a computer system, locations in the RF electromagnetic field pattern selected in step a) that correspond to local SAR values exceeding a preselected threshold;

c) determining, with a computer system and using the locations identified in step b), a cancellation electromagnetic field pattern that is defined by anti-circularly polarized modes of the RF coil array; and d) controlling the RF coil array, with a computer system, to produce an electromagnetic field in which local SAR is significantly reduced by simultaneously generating an RF electromagnetic field using the RF electromagnetic field pattern selected in step a) and a cancellation electromagnetic field using the cancellation electromagnetic field pattern determined in step c).

7. The method as recited in claim 6 in which the preselected threshold value in step b) is selected based on regulatory limits for local SAR.

8. The method as recited in claim 6 in which step c) includes minimizing an objective function that relates electromagnetic field values at the locations identified in step b) to cancellation electromagnetic field values at the locations identified in step b) and to the dark modes.

9. The method as recited in claim 8 in which the objective function minimized in step c) accounts for errors in the RF electromagnetic field pattern selected in step a).

10. A magnetic resonance imaging (MRI) system, comprising:

a magnet system configured to generate a polarizing magnetic field about at least a portion of a subject positioned in the MRI system;

a plurality of gradient coils configured to establish a magnetic field gradient about at least a portion of the subject positioned in the MRI system;

a radio frequency (RF) coil array including a plurality of RF coil elements, each RF coil element being configured to apply an RF field to at least a portion of the subject and to receive magnetic resonance (MR) signals therefrom;

a computer system programmed to:

select an RF electromagnetic field pattern for the RF coil array;

identify locations in the selected RF electromagnetic field pattern that correspond to local specific absorption rate (SAR) values that exceed a preselected threshold;

determine a cancellation electromagnetic field pattern that is defined by dark modes of the RF coil array; and direct the RF coil array to produce an electromagnetic field in which local SAR is significantly reduced by simultaneously generating an RF electromagnetic field using the selected RF electromagnetic field pattern and a cancellation electromagnetic field using the determined cancellation electromagnetic field pattern.

11. The magnetic resonance imaging system as recited in claim 10 in which the computer system is programmed to determine the cancellation electromagnetic field pattern by minimizing an objective function that relates electromagnetic field values at the identified locations to both cancellation electromagnetic field values at the identified locations and to the dark modes of the coil array.

12. The magnetic resonance imaging system as recited in claim 11 in which the objective function accounts for rotation of net magnetization of nuclear spins produced by a cancellation electromagnetic field associated with the cancellation electromagnetic field pattern.

13. The magnetic resonance imaging system as recited in claim 11 in which the objective function accounts for errors in the selected RF excitation pattern.

* * * * *